United States Patent
Fagot et al.

(10) Patent No.: US 10,714,501 B2
(45) Date of Patent: Jul. 14, 2020

(54) CO-INTEGRATION OF BULK AND SOI TRANSISTORS

(71) Applicants: STMicroelectronics (Rousset) SAS, Rousset (FR); STMicroelectronics (Crolles 2) SAS, Crolles (FR)

(72) Inventors: Jean-Jacques Fagot, Rousset (FR); Philippe Boivin, Venelles (FR); Franck Arnaud, St. Nazaire les Eymes (FR)

(73) Assignees: STMicroelectronics (Rousset) SAS, Rousset (FR); STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 16/057,466

(22) Filed: Aug. 7, 2018

(65) Prior Publication Data

US 2019/0057981 A1  Feb. 21, 2019

(30) Foreign Application Priority Data

Aug. 16, 2017  (FR) ...................................... 17 57702

(51) Int. Cl.
*H01L 27/12* (2006.01)
*H01L 21/762* (2006.01)
*H01L 21/84* (2006.01)
*H01L 29/808* (2006.01)
*H01L 27/06* (2006.01)

(52) U.S. Cl.
CPC ...... *H01L 27/1207* (2013.01); *H01L 21/7624* (2013.01); *H01L 21/84* (2013.01); *H01L 27/1203* (2013.01); *H01L 27/0605* (2013.01); *H01L 27/0688* (2013.01); *H01L 29/808* (2013.01)

(58) Field of Classification Search
CPC . H01L 27/1207; H01L 21/84; H01L 27/1203; H01L 29/98654
USPC ......... 438/154, 155, 188; 257/347, 348, 350
See application file for complete search history.

(56) References Cited

U.S. PATENT DOCUMENTS

| | | | |
|---|---|---|---|
| 2004/0079993 A1 | 4/2004 | Ning et al. | |
| 2004/0180478 A1 | 9/2004 | Yang et al. | |
| 2007/0235806 A1 | 10/2007 | Joshi et al. | |
| 2009/0140338 A1* | 6/2009 | Gauthier et al. | H01L 21/84 257/350 |

FOREIGN PATENT DOCUMENTS

WO   2006038164 A1   4/2006

OTHER PUBLICATIONS

INPI Search Report and Written Opinion for FR 1757702 dated Apr. 9, 2018 (9 pages).

(Continued)

*Primary Examiner* — Thinh T Nguyen
(74) *Attorney, Agent, or Firm* — Crowe & Dunlevy

(57) ABSTRACT

An electronic integrated circuit chip includes a first transistor arranged inside and on top of a solid substrate, a second transistor arranged inside and on top of a layer of semiconductor material on insulator having a first thickness, and a third transistor arranged inside and on top of a layer of semiconductor material on insulator having a second thickness. The second thickness is greater than the first thickness. The solid substrate extends underneath the layers of semiconductor material and is insulated from those layers by the insulator.

20 Claims, 4 Drawing Sheets

(56) References Cited

OTHER PUBLICATIONS

Wolf S Ed—Stanley Wolf: "Chap.11 Silicon-on-Insulator (SOI) Technology", Silicon Processing for Rhe VLSI Era—vol. 4 Deep—Submicron Process Techno, Lattice Press, US, Jan. 2002 (Jan. 2002), pp. 501-572, XP009112914, ISBN: 978-0-9616721-7-1 * figures 11-13*.

* cited by examiner

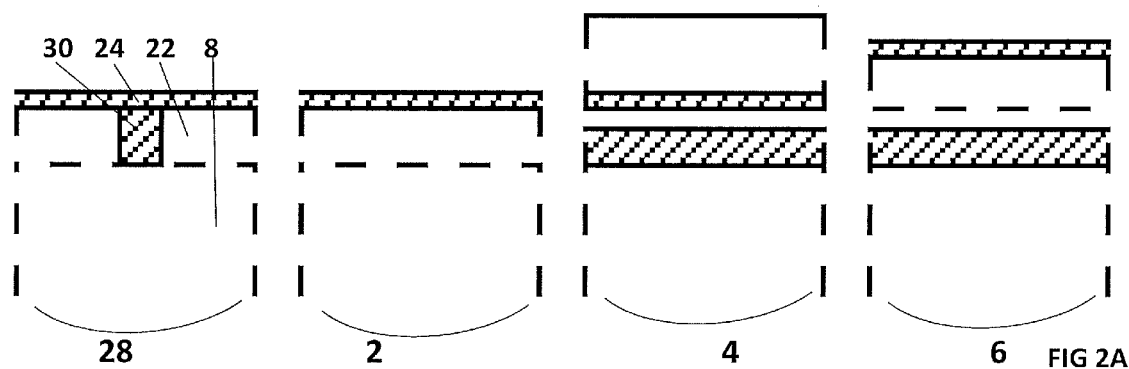
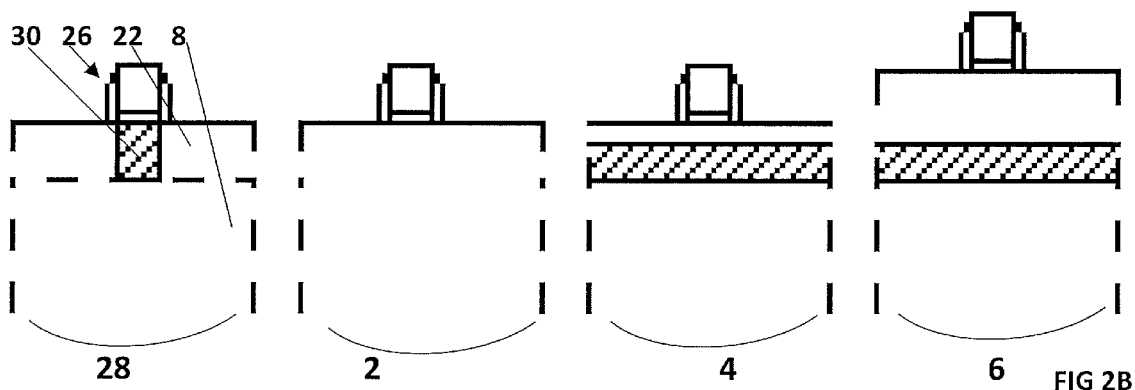

CO-INTEGRATION OF BULK AND SOI TRANSISTORS

PRIORITY CLAIM

This application claims the priority benefit of French Application for Patent No. 1757702, filed on Aug. 16, 2017, the content of which is hereby incorporated by reference in its entirety to the maximum extent allowable by law.

TECHNICAL FIELD

The present disclosure concerns electronic chips comprising transistors formed in a solid (bulk) substrate and transistors formed in a semiconductor-on-insulator (SOI) type substrate.

BACKGROUND

There exist different types of substrate structures on which transistors can be formed, for example, solid substrate structures or SOI substrate structures. Among transistors formed inside and on top of SOI structures, two types of transistors having different silicon layer thicknesses can be distinguished.

PDSOI (for Partially Depleted SOI) transistors are characterized by a silicon layer having a thickness which is sufficiently large, for example, greater than 30 nm, for the silicon layer never to be fully depleted in operation.

PDSOI transistors comprise a doped channel and an insulator layer (BOX) having a thickness generally in the range from 100 to 200 nm. PDSOI transistors are generally used as power transistors for analog circuits.

The forming of PDSOI transistors has the advantage of being known and controlled in the electronics industry. However, decreasing the dimensions of such components, other than the thickness of the silicon layer, while keeping a high performance level, is an issue.

FDSOI (Fully Depleted SOI) transistors are characterized by a silicon layer having a thickness sufficiently small, for example, smaller than 20 nm, for the silicon layer to be fully depleted in certain operating modes.

FDSOI transistors generally comprise a non-doped or lightly doped channel and an insulator layer (BOX) having a thickness generally in the range from 5 to 50 nm. The source/drain resistance of such transistors is greater than that of PDSOI transistors.

FDSOI transistors are preferred for logic circuits, because of their ability to operate rapidly.

An advantage of FDSOI transistors is that they have leakage currents and a power consumption lower than those of PDSOI transistors. Further, it is easier to control short-channel effects therein. However, the small dimensions may make the manufacturing difficult. Further, the small silicon thickness limits electric currents.

In common integrated circuits, co-integrations of bulk transistors and of SOI transistors of a given type can be encountered.

SUMMARY

Integrated circuit chips comprising bulk transistors, FDSOI transistors, and PDSOI transistors are here provided and a method of simply forming such chips is also provided.

Thus, an embodiment provides an electronic integrated circuit chip comprising a first transistor arranged inside and on top of a solid semiconductor substrate, a second transistor arranged inside and on top of a layer of semiconductor material on insulator having a first thickness, and a third transistor arranged inside and on top of a layer of semiconductor material on insulator having a second thickness, the second thickness being greater than the first thickness.

According to an embodiment, the first thickness is smaller than 20 nm.

According to an embodiment, the first thickness is in the range from 5 to 20 nm.

According to an embodiment, the first thickness is equal to 7 nm to within 10%.

According to an embodiment, the second thickness is greater than 30 nm.

According to an embodiment, the second thickness is in the range from 30 to 50 nm.

According to an embodiment, the second thickness is equal to 35 nm to within 10%.

An embodiment provides a method of manufacturing on a same integrated circuit chip, in a first region, a first transistor formed in a solid substrate, in a second region, a second transistor formed in a layer of semiconductor material on insulator having a first thickness, and, in a third region, a third transistor formed in a layer of semiconductor material on insulator having a second thickness greater than the first thickness. The method comprises: providing a semiconductor-on-insulator structure having its layer of semiconductor material having the first thickness; forming first and second insulating layers on the structure; removing the first and second insulating layers from the first region; oxidizing the layer of semiconductor material of the semiconductor-on-insulator structure in the first region; removing the second insulating layer from the third region; at least partially removing the oxide from the first region and the first insulating layer from the third region; growing silicon on the substrate of the first region and on the layer of semiconductor material of the third region until the layer of semiconductor material of the third region reaches the second thickness; and removing the first and second insulating layers from the second region.

According to an embodiment, the oxide of the first region is totally removed.

According to an embodiment, a portion of the oxide of the first region is kept.

According to an embodiment, the first insulating layer is made of silicon oxide.

According to an embodiment, the second insulating layer is made of silicon nitride.

According to an embodiment, the first thickness is smaller than 20 nm.

According to an embodiment, the second thickness is greater than 30 nm.

BRIEF DESCRIPTION OF THE DRAWINGS

The foregoing and other features and advantages will be discussed in detail in the following non-limiting description of specific embodiments in connection with the accompanying drawings, wherein:

FIGS. 2A and 2B illustrate steps of a variation of the manufacturing method described in relation with FIGS. 1A to 1H.

DETAILED DESCRIPTION

Figure 1A:
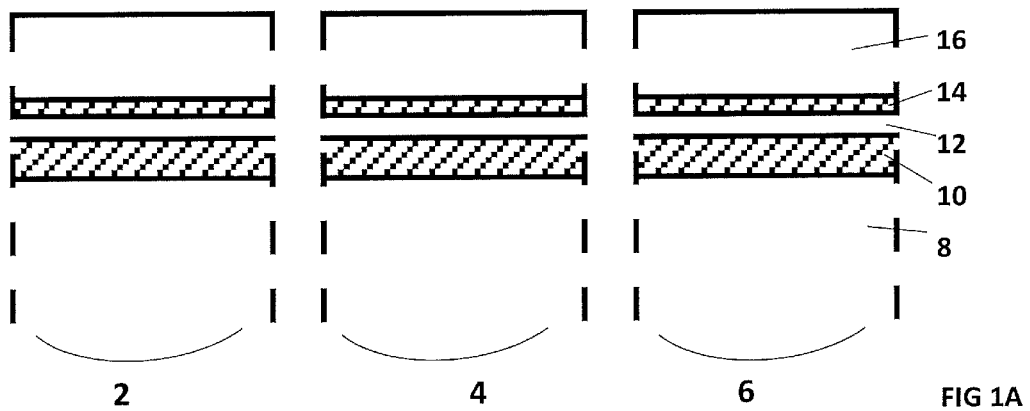
FIGS. 1A to 1H are cross-section views of three regions of a chip at different steps of a method of manufacturing three types of transistors.

The same elements have been designated with the same reference numerals in the various drawings and, further, the various drawings are not to scale. For clarity, only those steps and elements which are useful to the understanding of the described embodiments have been shown and are detailed. In particular, the manufacturing of the initial SOI structure is not detailed.

The term "approximately" is used herein to designate a tolerance of plus or minus 10%, preferably plus or minus 5%, of the value in question.

FIGS. 1A to 1H are cross-section views of three regions of a same integrated circuit chip at different steps of a method of manufacturing three types of transistors. A bulk transistor will be manufactured inside and on top of a region 2. An FDSOI transistor will be manufactured inside and on top of a region 4. A PDSOI transistor will be manufactured inside and on top of a region 6.

FIG. 1A illustrates an initial manufacturing step. The three regions 2, 4, and 6 comprise an SOI structure, that is, a semiconductor substrate 8 covered with an insulating layer 10 covered with a layer of semiconductor material 12. Substrate 8 and layer 12 of semiconductor material are, for example, made of silicon but could be made of another semiconductor material such as silicon germanium. Insulating layer 10 is, for example, made of silicon oxide. The thickness of layer 12 of semiconductor material is that of the layer of semiconductor material of a FDSOI transistor, that is, smaller than 20 nm. The thickness of layer 12 is for example in the range from 5 to 12 nm, for example, approximately 7 nm.

During the initial manufacturing step, layer 12 of regions 2, 4, and 6 is covered with an insulating layer 14, for example, made of silicon oxide. Insulating layer 14 is covered with an insulating layer 16. Layer 16 is for example made of silicon nitride. Layer 14 is an etch stop layer and layer 16 is a masking layer.

Figure 1B:
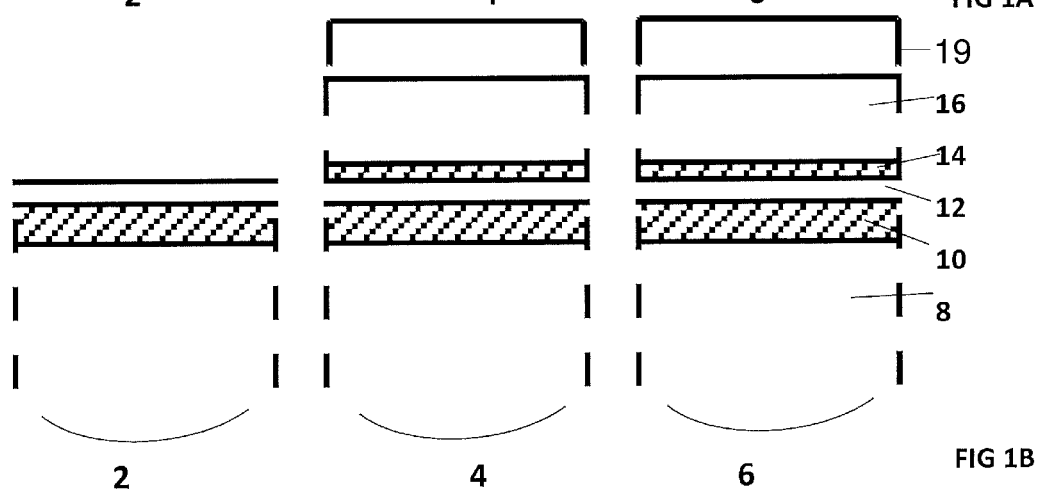

During the step illustrated in FIG. 1B, a resin mask 19 is deposited on regions 2, 4, and 6. An opening is formed in this mask 19 above region 2. Layer 16 and layer 14 of region 2 are removed through this opening. The resin mask 19 is removed before or after the removal of layer 14.

Figure 1C:
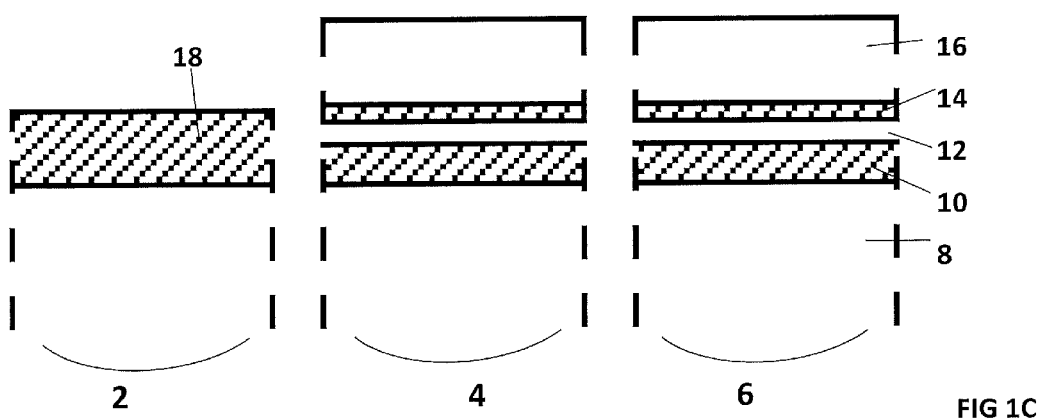

An oxidation is performed during the step illustrated in FIG. 1C. Layer 12 of semiconductor material is oxidized so that, in region 2, substrate 8 is covered with a single oxide layer 18 comprising insulating layer 10. The thickness of layer 18 is, for example, equal to the thickness difference desired between the layer of semiconductor material of an FDSOI transistor and that of a PDSOI transistor. Regions 4 and 6 are protected by insulating silicon nitride layer 16 and are not affected by the oxidation.

Figure 1D:
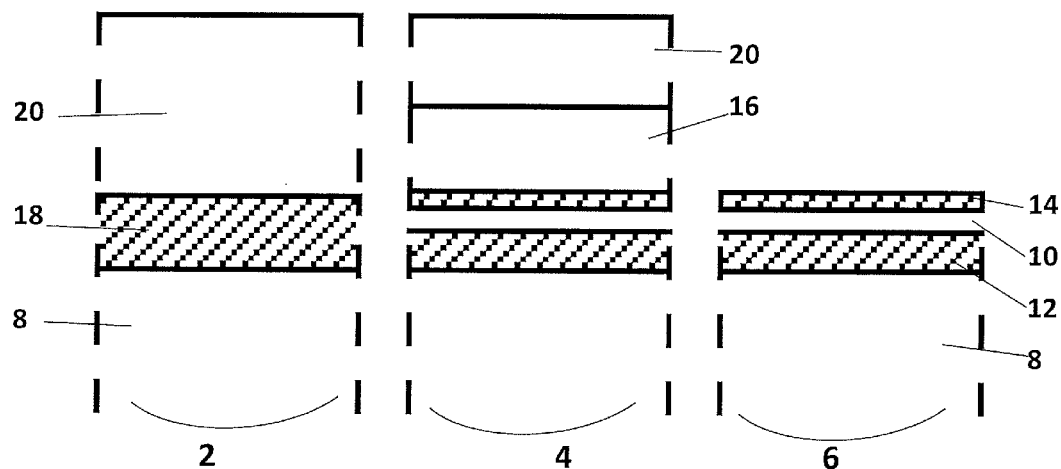

During the step illustrated in FIG. 1D, a resin mask 20 is deposited on regions 2, 4, and 6. An opening is formed in mask 20 above region 6. Insulating layer 16 of region 6 is then etched through this opening.

Figure 1E:
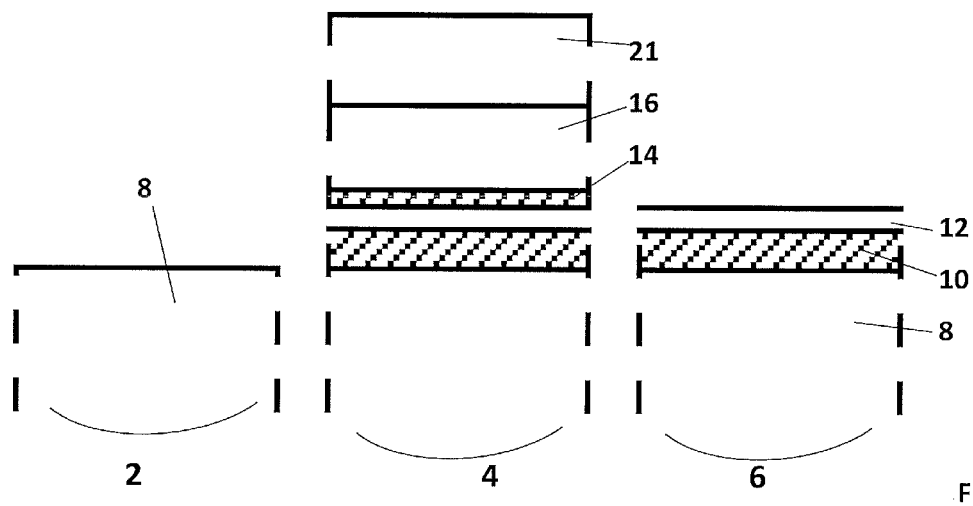

During the step illustrated in FIG. 1E, the remainders of mask 20 are removed and a new resin mask 21 is deposited on regions 2, 4, and 6. Openings are formed in mask 21 above regions 2 and 6.

Regions 2 and 6 are etched through the openings to remove silicon oxide layer 18 from region 2 and silicon oxide region 14 from region 6. Substrate 8 of region 2 and layer 12 of semiconductor material of region 6 are thus exposed.

Figure 1F:
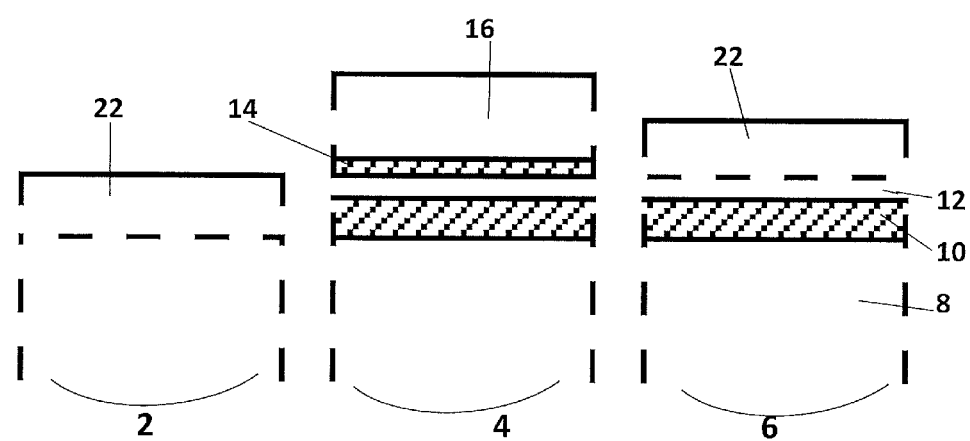

During the step illustrated in FIG. 1F, mask 21 is removed from region 4. An epitaxy is then performed to grow silicon in region 2, on substrate 8, and in region 6, on layer 12 of semiconductor material. Silicon areas 22 are formed by this epitaxy and are separated, in FIG. 1F, from substrate 8 and from layer 12 by dotted lines. Areas 22 have a same thickness, which corresponds to the thickness difference between the layer of semiconductor material of an FDSOI transistor and that of a PDSOI transistor. The thickness of areas 22 is for example greater than 10 nm, for example, 25 nm. Thus, in region 6, layers 12 and 22 form a single layer of semiconductor material having a thickness greater than 30 nm. The thickness of this single region is for example in the range from 30 to 50 nm, for example, approximately equal to 35 nm.

Region 4 is protected by layer 16 and is not affected by the epitaxy.

Figure 1G:
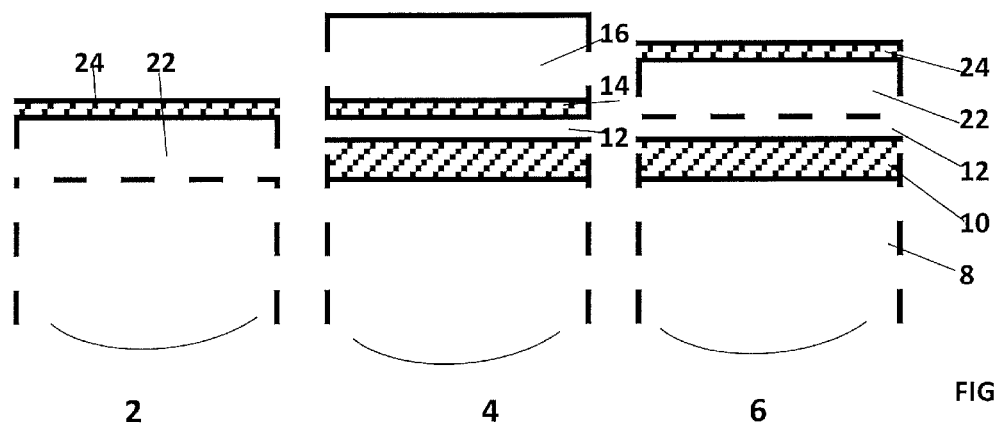

During the step illustrated in FIG. 1G, a protection layer 24, for example, made of silicon oxide, is formed on areas 22 by thermal oxidation.

Figure 1H:
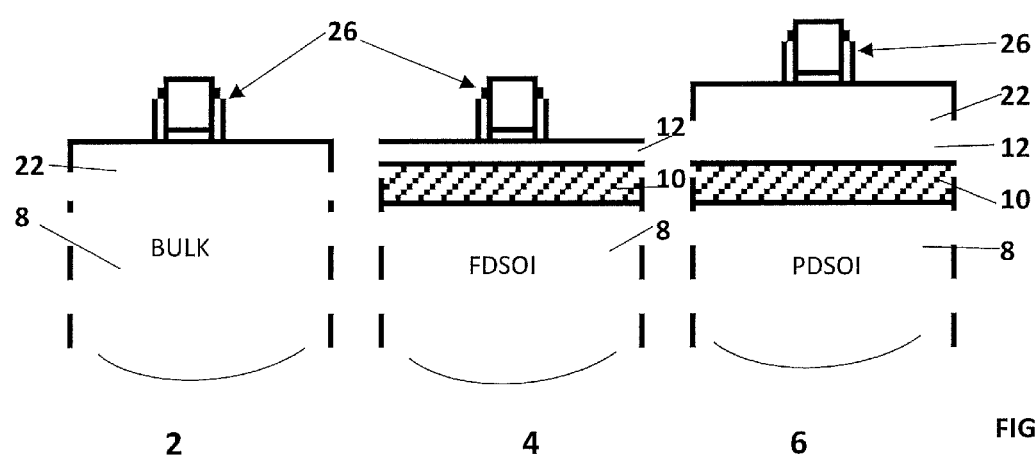

During the step illustrated in FIG. 1H, insulating layer 16 is removed by etching. Regions 2 and 6 are protected by protection layer 24 and are not affected by the etching. Protection layers 24 of regions 2 and 6 and insulating layer 14 are then removed.

Transistors, shown in the drawings by their gates 26, are then formed in regions 2, 4, and 6 by usual manufacturing methods comprising the forming of a gate insulator, of a gate conductor, of spacers, and of source and drain areas.

The transistor of region 2 is a bulk transistor (BULK), that of region 4 is an FDSOI transistor, and that of region 6 is a PDSOI transistor.

According to another embodiment, it is possible to adjust the manufacturing method described in relation with FIGS. 1A to 1H to form, in addition to regions 2, 4, and 6, regions 28 comprising a portion 30 of oxide layer 18 of FIGS. 1C and 1D. Regions 28 are, for example, located between two regions 2, 4, or 6, and portions 30 are, for example, used to insulate the transistors of these regions from one another.

FIG. 2A corresponds to the step of FIG. 1G. Regions 2, 4, and 6, on the right-hand side, are those described in relation with FIG. 1G. Region 28, on the left-hand side, is obtained by the same steps as region 2, except for the step of FIG. 1E, which is modified. More specifically, during the step of FIG. 1E, a portion 30 of oxide layer 18 of region 28 is not removed. This portion is for example line-shaped. The epitaxy of the step of FIG. 1F then grows silicon in region 28 around portion 30.

The transistor gates being all formed with an equal pitch, region 28 may correspond to a region where a gate will be formed but where no transistor is desired to be formed.

As illustrated in FIG. 2B, having, as right-hand regions, regions 2, 4, and 6 illustrated in FIG. 1H, portion 30 of region 28, on the left-hand side, is then located under the location where a gate will be formed.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A method of manufacturing distinct types of transistors on a same integrated circuit chip, comprising:
    providing a semiconductor-on-insulator structure having a layer of semiconductor material having a first thickness over an insulating layer over a semiconductor substrate;
    masking second and third regions of the semiconductor-on-insulator structure;

oxidizing the layer of semiconductor material in a first region of the semiconductor-on-insulator structure to form an oxidized layer;

masking the second region of the semiconductor-on-insulator structure;

removing the oxidized layer and insulating layer in the first region to expose a first surface of the semiconductor substrate;

removing the insulating layer in the third region to expose a second surface of the layer of semiconductor material epitaxially growing first semiconductor material on the exposed first surface of the semiconductor substrate in the first region to form a bulk semiconductor region;

epitaxially growing second semiconductor material on the exposed second surface of the layer of semiconductor material in the third region to form a layer of semiconductor material having a second thickness;

forming, in the first region, a first transistor in said bulk semiconductor region;

forming in the second region, a second transistor in the layer of semiconductor material having the first thickness; and forming, in the third region, a third transistor in said epitaxially grown second semiconductor material having the second thickness.

2. The method of claim 1, wherein the first thickness is smaller than 20 nm.

3. The method of claim 1, wherein the first thickness is in a range from 5 to 20 nm.

4. The method of claim 1, wherein the first thickness is equal to 7 nm to within 10%.

5. The method of claim 1, wherein the second thickness is greater than 30 nm.

6. The method of claim 1, wherein the second thickness is in a range from 30 to 50 nm.

7. The method of claim 1, wherein the second thickness is equal to 35 nm to within 10%.

8. The method of claim 1, wherein the first transistor is a bulk transistor, the second transistor is a fully depleted silicon on insulator transistor and the third transistor is a partially depleted silicon on insulator transistor.

9. A method of manufacturing distinct types of transistors on a same integrated circuit chip having a semiconductor-on-insulator structure formed by a layer of semiconductor material over an insulating layer over a semiconductor substrate, comprising:

forming a first mask covering second and third regions of the semiconductor-on-insulator structure;

oxidizing the layer of semiconductor material in a first region of the semiconductor-on-insulator structure which is not covered by the first mask to form an oxidized layer on the semiconductor substrate;

forming a second mask covering the second region of the semiconductor-on-insulator structure;

removing the oxidized layer from the first region to expose the semiconductor substrate;

exposing the layer of semiconductor material in the third region;

growing first semiconductor material on the exposed semiconductor substrate in the first region;

growing second semiconductor material on the layer of semiconductor material in the third region;

forming a first transistor supported by the first semiconductor material of the first region;

forming a second transistor supported by the layer of semiconductor material of the second region; and forming a third transistor supported by the second semiconductor material of the third region.

10. The method of claim 9, wherein the insulating layer is made of an oxide material.

11. The method of claim 9, wherein the first and second masks include a nitride material.

12. The method of claim 9, wherein the first transistor is a bulk transistor, the second transistor is a fully depleted silicon on insulator transistor and the third transistor is a partially depleted silicon on insulator transistor.

13. A method of manufacturing distinct types of transistors on a same integrated circuit chip having a semiconductor-on-insulator structure formed by a layer of semiconductor material over an insulating layer over a semiconductor substrate, comprising:

forming a mask covering a second region of the semiconductor-on-insulator structure;

oxidizing the layer of semiconductor material in a first region of the semiconductor-on-insulator structure which is not covered by the mask to form an oxidized layer on the semiconductor substrate;

removing the oxidized layer from the first region to expose the semiconductor substrate;

exposing the layer of semiconductor material in the second region;

growing first semiconductor material on the exposed semiconductor substrate in the first region;

growing second semiconductor material on the layer of semiconductor material in the third region;

forming a first transistor supported by the first semiconductor material of the first region; and forming a second transistor supported by the second semiconductor material of the second region.

14. The method of claim 13, wherein the insulating layer is made of an oxide material.

15. The method of claim 13, wherein the mask includes a nitride material.

16. The method of claim 13, wherein the first transistor is a bulk transistor and the second transistor is a partially depleted silicon on insulator transistor.

17. A method of manufacturing distinct types of transistors on a same integrated circuit chip having a semiconductor-on-insulator structure formed by a layer of semiconductor material in contact with an insulating layer which is in contact with a semiconductor substrate, comprising:

forming a mask covering a second region of the semiconductor-on-insulator structure;

completely oxidizing a thickness of the layer of semiconductor material in a first region of the semiconductor-on-insulator structure which is not covered by the mask to form an oxidized layer in contact with the semiconductor substrate;

removing the oxidized layer from the first region to expose an upper surface of the semiconductor substrate;

exposing an upper surface of the layer of semiconductor material in the second region;

epitaxially growing first semiconductor material at the upper surface of the exposed semiconductor substrate in the first region;

epitaxially growing second semiconductor material at the upper surface of the layer of semiconductor material in the third region;

forming a first transistor supported by the first semiconductor material of the first region; and forming a second transistor supported by the second semiconductor material of the second region.

18. The method of claim 17, wherein the first transistor is a bulk transistor and the second transistor is a partially depleted silicon on insulator transistor.

19. A method of manufacturing distinct types of transistors on a same integrated circuit chip having a semiconductor-on-insulator structure formed by a layer of semiconductor material over an insulating layer over a semiconductor substrate, comprising:

forming a first mask covering second and third regions of the semiconductor-on-insulator structure;

completely oxidizing a thickness of the layer of semiconductor material in a first region of the semiconductor-on-insulator structure which is not covered by the mask to form an oxidized layer in contact with the semiconductor substrate;

forming a second mask covering the second region of the semiconductor-on-insulator structure;

removing the oxidized layer from the first region to expose an upper surface of the semiconductor substrate;

exposing an upper surface of the layer of semiconductor material in the third region;

epitaxially growing first semiconductor material at the upper surface of the exposed semiconductor substrate in the first region;

epitaxially growing second semiconductor material at the upper surface of the layer of semiconductor material in the third region;

forming a first transistor supported by the first semiconductor material of the first region;

forming a second transistor supported by the layer of semiconductor material of the second region; and forming a third transistor supported by the second semiconductor material of the third region.

20. The method of claim 19, wherein the first transistor is a bulk transistor, the second transistor is a fully depleted silicon on insulator transistor and the third transistor is a partially depleted silicon on insulator transistor.

* * * * *